(12) United States Patent
Crowe

(10) Patent No.: US 8,390,469 B2
(45) Date of Patent: *Mar. 5, 2013

(54) EXTERNAL CONDITIONS AUDIO PLAYBACK SYSTEM AND METHOD

(75) Inventor: Stephen Crowe, Tacoma, WA (US)

(73) Assignee: Dean A. Craine, Bellevue, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/184,877

(22) Filed: Jul. 18, 2011

(65) Prior Publication Data

US 2011/0285547 A1 Nov. 24, 2011

Related U.S. Application Data

(63) Continuation of application No. 12/069,959, filed on Feb. 13, 2008, now Pat. No. 7,982,629.

(51) Int. Cl.
*G08B 25/08* (2006.01)

(52) U.S. Cl. .......................... 340/692; 701/1

(58) Field of Classification Search .................. 340/692, 340/425.5; 307/10.1; 342/357.1, 357.13; 701/1, 36
See application file for complete search history.

(56) References Cited

U.S. PATENT DOCUMENTS

| 5,245,694 | A * | 9/1993 | Zwern ............................ 704/200 |
| 5,959,577 | A * | 9/1999 | Fan et al. .................. 342/357.42 |
| 6,192,340 | B1 * | 2/2001 | Abecassis ...................... 704/270 |
| 6,526,335 | B1 * | 2/2003 | Treyz et al. ........................ 701/1 |
| 6,799,201 | B1 * | 9/2004 | Lee et al. ....................... 709/217 |
| 7,406,321 | B2 * | 7/2008 | Beiermeister ............ 340/995.13 |
| 7,518,530 | B2 * | 4/2009 | Ohno et al. ................ 340/425.5 |
| 7,982,629 | B2 * | 7/2011 | Crowe ........................... 340/692 |

* cited by examiner

*Primary Examiner* — John A Tweel, Jr.
(74) *Attorney, Agent, or Firm* — Dean A. Craine

(57) ABSTRACT

A method and system that controls the playing of different audio or video files by an electric device in a motor vehicle that includes a plurality of different audio or video files and an audio file player software program. The electronic device is coupled to at least one external sensor that measures one of the following: the motor vehicle's current location, the time of day, and/or the weather or temperature. The software program is configured to automatically play the audio file associated with an external condition when the external condition occurs. When the motor vehicle is operating, and the occupant is listening to the electronic device, the audio or video files are automatically played based on the occurrence of the linked external condition.

8 Claims, 6 Drawing Sheets

110

EXTERNAL CONDITIONS

1 - LOCATION

2 - TIME OF DAY

3 - DAY OF THE WEEK

4 - WEATHER

5 - TEMPERATURE

6 - TRAFFIC CONDITIONS

113

*FIG. 4*

EXTERNAL CONDITIONS AUDIO PLAYBACK SYSTEM AND METHOD

This is a continuation application of U.S. utility patent application (application Ser. No. 12/069,959) filed on Feb. 13, 2008 which was based on and claimed the benefit of U.S. Provisional Application No. 60/901,164 filed on Feb. 13, 2007.

BACKGROUND OF THE INVENTION

1. Field of the Invention

This invention relates to mobile audio playback devices, and more particularly to audio playback devices that are controlled in part by external conditions such as their location, the time of day, traffic conditions or weather.

2. Description of the Related Art

AM/FM radios, HD radios, GPS navigational devices, satellite radios, MP3 players, and DVD players, CD players, are relatively common devices used in motor vehicles. When a song or a recording is played on such devices, it typically continues to play until the end of the song or the recording is reached or until the operator intervenes and manually terminates the song or the recording.

It is generally believed that devices operated in a motor vehicle, such as cellular telephones, PDA's, MP3 players and radios, are distracting to drivers while driving and a major cause of motor vehicle accidents. In response, many municipalities have promulgating rules and regulations to prevent such devices from being operated by the driver while driving.

Aggressive driving and road rage are major concerns of law enforcement and transportation safety officials. Heavy congestion and stress are believed to be two possible causes of these types of behavior. It is postulated by the inventor that certain types of music may be able to reduce stress and reduce these types of behaviors.

Commuters who drive to and from work each work day typically do so at the same times of day. The commuter soon learns which radio programs are available at these times. In many instances, the radio programs that the commuter mostly enjoys are not available during the commute times. Many resourceful commuters have begun to record programs on their home computers connected to the World Wide Web and then transfer them onto an audio playback device for playback later in their motor vehicles. Unfortunately, the selection of different files and operation of these audio playback devices can also be distracting.

What is needed is an audio playback device that can be used to store selected audio files that can be automatically played back or at different selected times according to external conditions, such as the location, the time of day, traffic conditions and weather.

SUMMARY OF THE INVENTION

It is an object of the present invention to provide an audio playback device that can be used to store selected audio files and then programmed to automatically playback the audio files at different times according to external conditions.

It is another object of the present invention to provide such an audio or video file or recording playback device that automatically changes the audio file or recording played back according to the occurrence of one or more external conditions.

It is a further object of the present invention to provide such an audio playback device that enables the user to create a playlist of audio or video files or recordings that automatically play according to the occurrence of one or more of the external conditions.

These and other objects are met by a location based audio playback device that includes a permanently fixed or handheld electronic device located inside a motor vehicle. Loaded into the working memory of the electronic device is an audio or video software program that collects and organizes files or recordings in a general menu, creates playlists, and then associates the files or recordings, or the playlists with an external condition. The software program creates an external condition menu page that allows the user to tag some or all of the audio or video files to one or more external conditions capable of being monitored and selectively chosen by the user. An external condition may include the motor vehicle's physical location, the motor vehicle's velocity, day of the week, the time of day, the outdoor temperatures or weather conditions. When the external condition occurs, the audio or video file, or recording, or playlist tagged to the external conditions is automatically played.

In the preferred embodiment, the electronic device is linked to devices designed to detect the occurrence of an external condition. One type of device may be a GPS based satellite receiver or GPS based cellular telephone capable of tracking motor vehicle's location, driving direction, and speed. The GPS receiver or cellular telephone may communicate with an external traffic monitoring service to provide continuous and intermittent traffic information on roadways in the vicinity of the motor vehicle. Such services could also provide weather information. The electronic device may be also linked to an internal or external clock, a date or calendar reporting program or device, a radio based, weather reporting device or to an outdoor thermometer.

As stated above, the software program includes a menu that couples an external condition to one or more audio or video file stored on the file storage device. When the specific external condition occurs, the individual audio or video files or recordings in the playlist are automatically played. The driver or passenger does not need to manually select files, recordings, or playlists. If a particular external condition occurs, the software program which automatically and continuously monitors for the external condition, automatically changes the audio and video files or recordings played according to the occurrence of the particular external condition.

DESCRIPTION OF THE DRAWINGS

FIG. 4 is a diagram showing a plurality of audio files being tagged to a playlist which is then tagged to an external condition.

DESCRIPTION OF THE PREFERRED EMBODIMENT(S)

Figure 1:
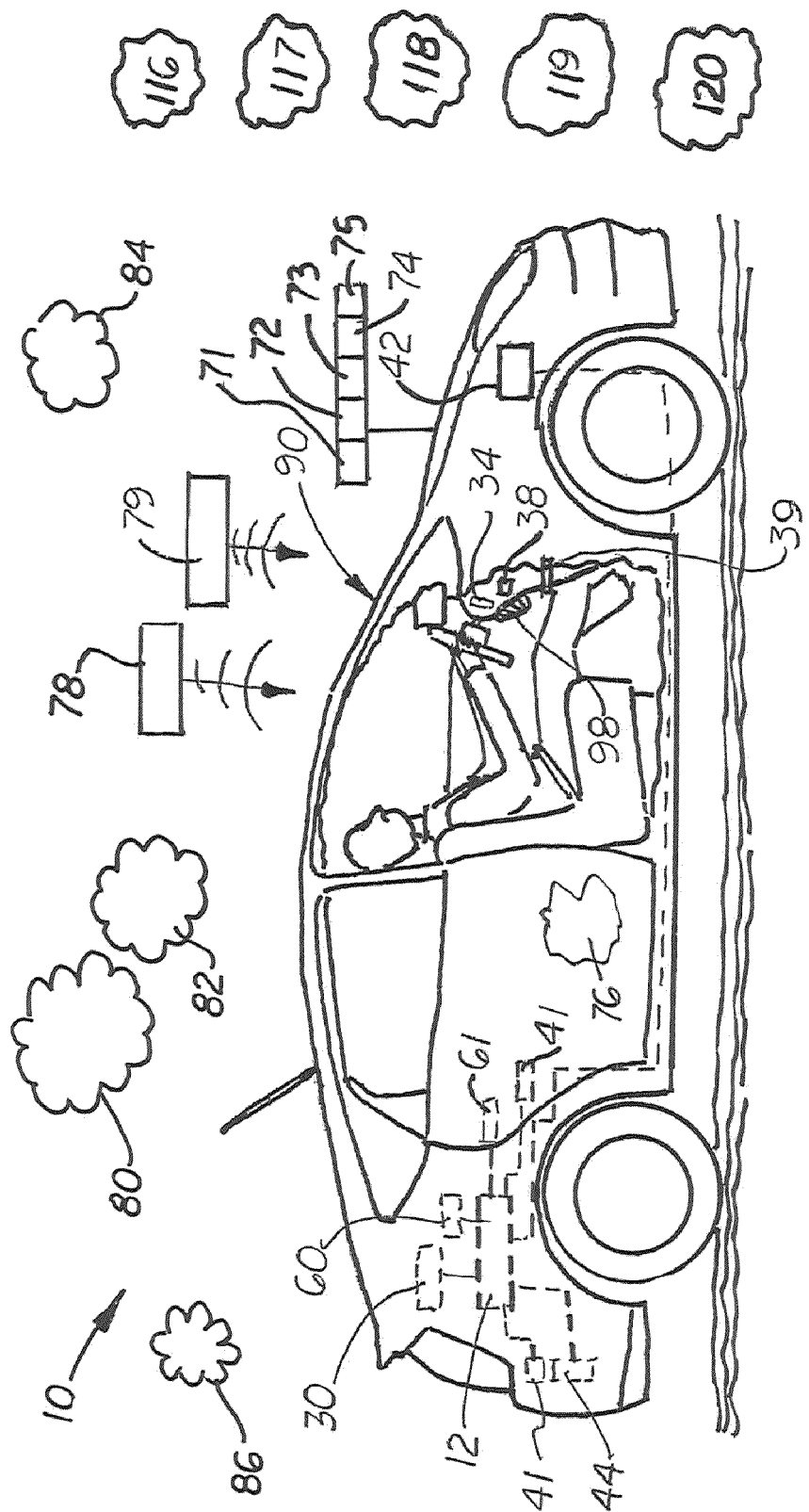
FIG. 1 is a side elevational view of a motor vehicle with an external conditions controlled audio playback system mounted therein.
Figure 2:
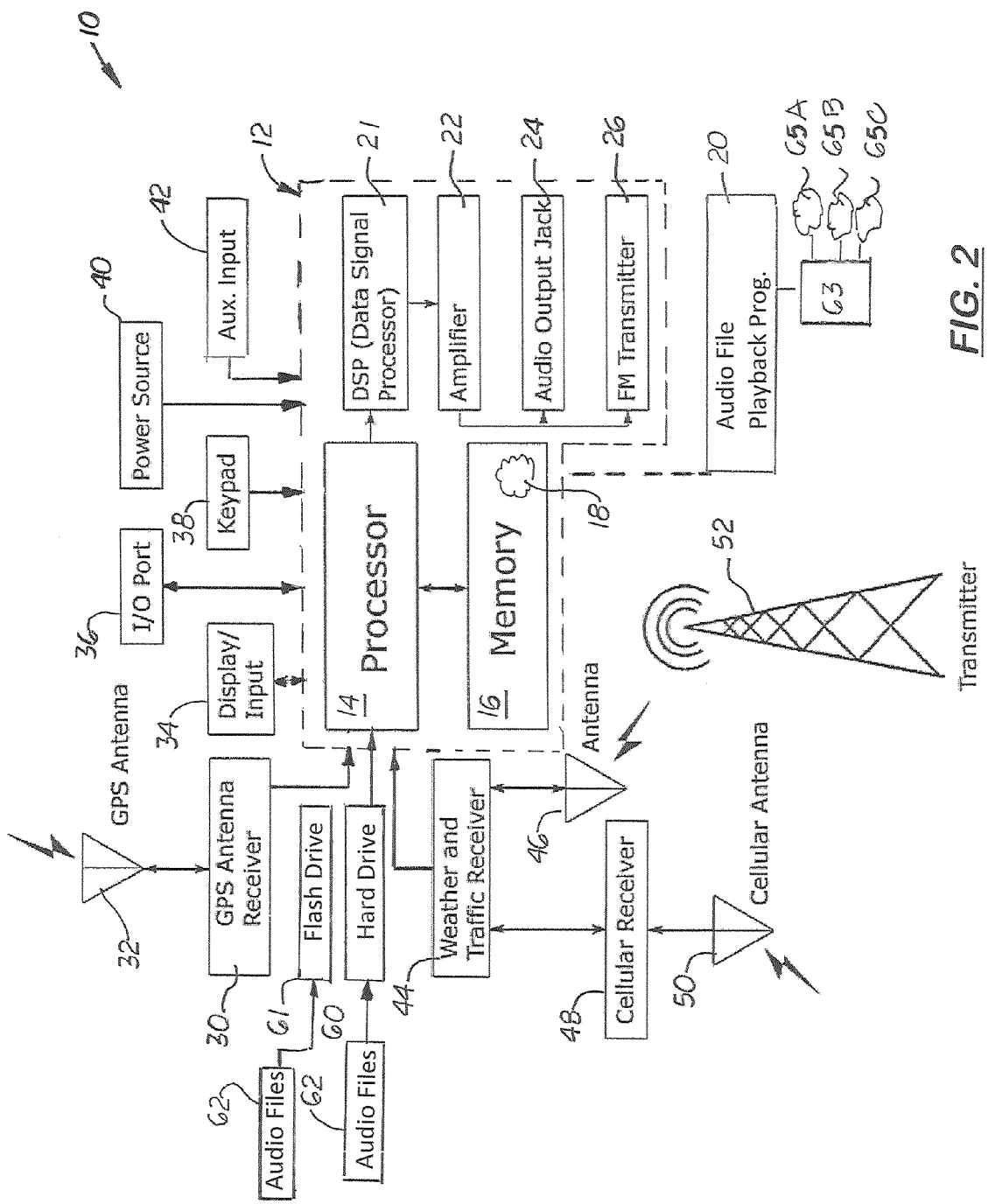
FIG. 2 is an overall diagram of the system.
Figure 3:
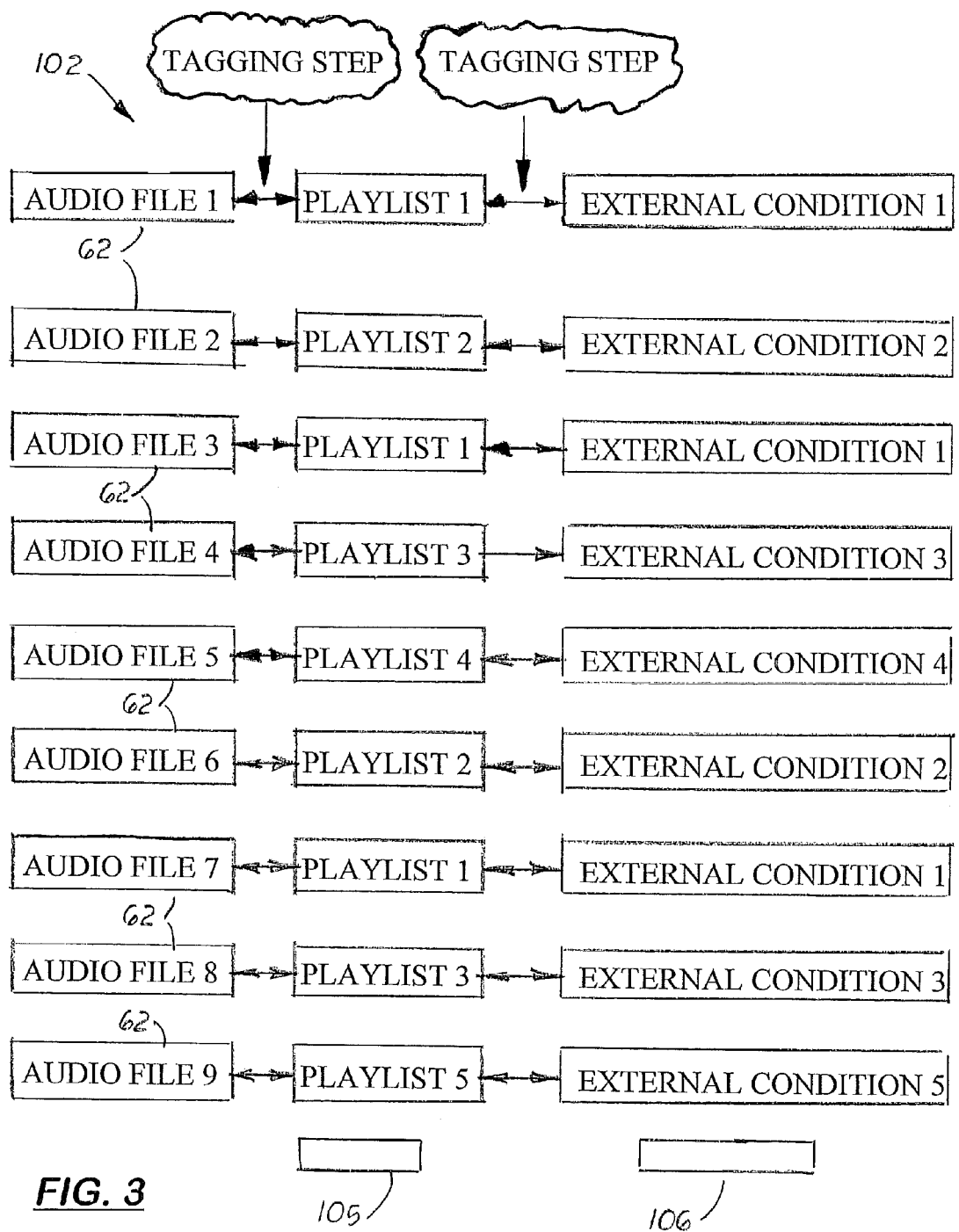
FIG. 3 is a diagram showing a plurality of audio files tagged to different external conditions.
Figure 5:
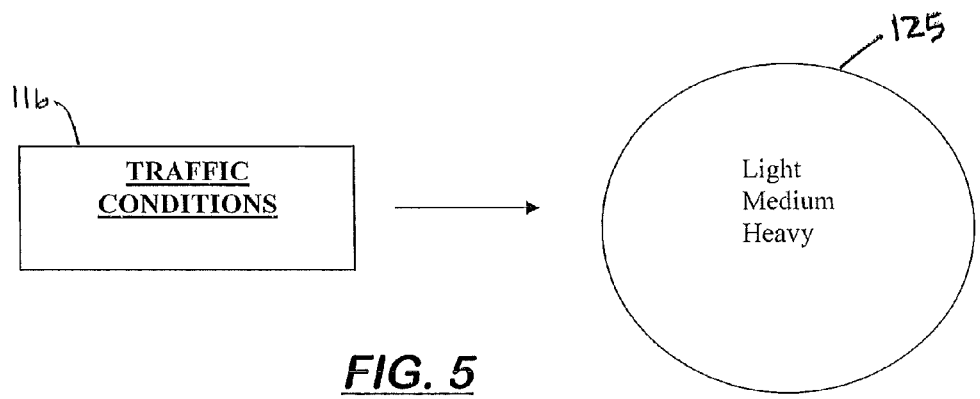
FIG. 5 is an illustration showing the Traffic Conditions menu coupled to its sub-category menu containing more specific traffic conditions.

Referring to the accompanying FIGS. 1-9, there is shown a system 10 that controls the playback of different audio files or recordings, referred hereinafter as files, by a permanently fixed or a portable electronic device 12 located in a motor vehicle 90. The device 12 contains a software program that controls the playback of files in the motor vehicle 90 according to the occurrence of pre-selected external conditions. As shown in FIG. 3, the external conditions may include the motor vehicle's current location 76, the time of day 80, the day of the week 82, the weather 84 of the outside temperature, or traffic conditions 86.

The electronic device 12, which may be a built-in computer, a personal digital assistant or a MP3 player, is mounted anywhere inside the motor vehicle 90. The electronic device 12 is connected to a dedicated electrical power source 40 or to the motor vehicle's electrical circuit 42. Connected to the electrical device 12 is a display or touch screen 34. Attached to the electrical device 12 a non-touch display 34 is used, is an optional manual input device, such as a keyboard 38, a scrolling pad 39. Also connected to the electrical device 12, is an internal file storage device, such as a hard drive 60, or an external storage device, such as a flash card or drive 61. Stored on the hard drive 60 or flash drive 61 are a plurality of audio or video files 62 for playback through the motor vehicle's entertainment system 98 or through speakers (not shown) directly connected to the electronic device 12. It should be understood, that the electronic device 12 may be an 'aftermarket' product designed to connect to the motor vehicle's existing audio control system 98, or it may be integrally built into the motor vehicle's on-board audio control system.

When designed as a component that connects to an existing motor vehicle audio system 90, the electronic device 12 includes a central processor 14 and working memory 16. Built into the motherboard of the electronic device's 12 is a CMOS program 15 that tracks the time and date. Loaded into the electronic device's working memory 16 is an external conditioned audio file playback program 20 designed to store and organize audio files 62, to create playlists 63 contained selected audio files 62 and to control playback of the audio files 62 or a playlist 65A-C. The program 20 associates playback of individual audio files 62 or a playlist 63 based on the occurrence of a particular external condition selected by the user. The electronic device 12 may include a data signal processor (DSP) 20, an amplifier 22, an audio output jack 24 and a FM transmitter 26.

During setup, the audio program 20 first conducts a scan to search for audio files 62 stored on the hard drive 60 or flash drive 61. The audio files 62 may be any audio file format used today, such as WMA, AAC, MP3 or MP4. When the audio files 62 have been found, they are then presented in a first menu page 102 in a list format as shown in FIG. 3. After the audio files 62 are found, the user then can create different playlists and assign some or all for the audio files 62 to a playlist.

The first menu page 102 shown in FIG. 3 includes a 'File' button 105 that allows the user to add and delete audio files to and from the storage device and to add or delete playlists. Also, on the first menu page 102 is an 'External Condition' button 106 that allows the user to create, edit or delete an External Condition from the external condition list 110 shown in FIG. 4. Each External condition must be linked to a particular sensor or measurement device that determines the value of the external condition being measured. Such sources may include but not limited to, a GPS based satellite or GPS based cellular communication receiver capable of tracking motor vehicle's location, driving direction, and speed. The GPS receiver or cellular telephone may communicate with an external traffic monitoring service 78 to provide continuous and intermittent traffic information on roadways in the vicinity of the motor vehicle. Such sources may also include a satellite or radio broadcast based weather service 79. The electronic device 12 may be also linked to an internal or external clock, a date or calendar reporting program or device, a radio based, weather reporting device or to an outdoor thermometer. The 'External Condition' menu 110 may include an option button 113 that allows the user to create, edit or delete external conditions from the program.

Figure 6:
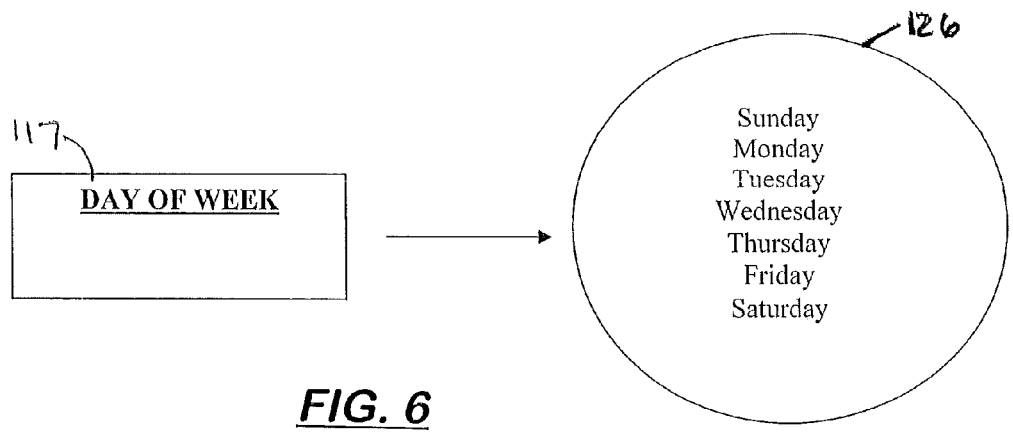
FIG. 6 is an illustration showing the showing the Days of Week menu coupled to its sub-category menu container the names of the days in a week.
Figure 7:
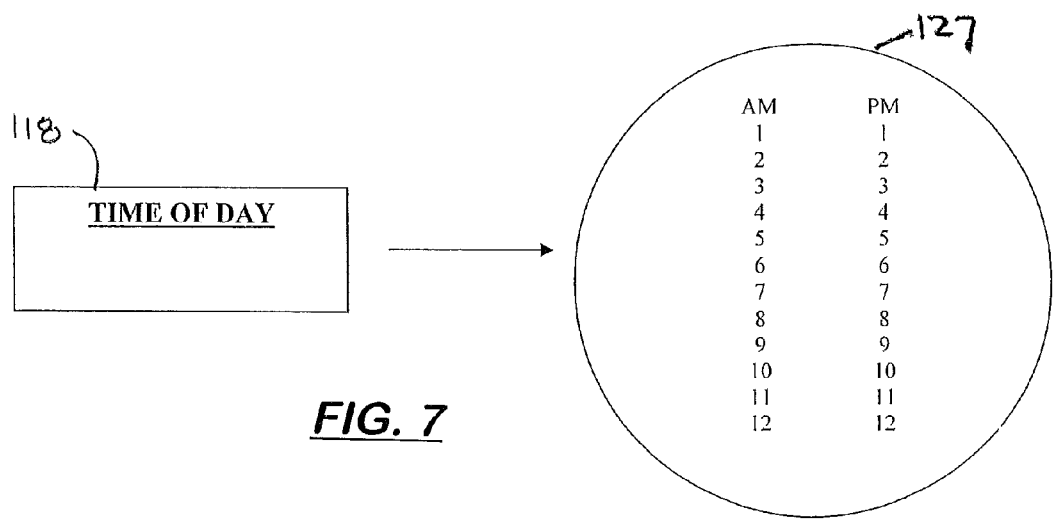
FIG. 7 is an illustration showing the Time of Day menu coupled to its sub-category container twenty-four hours in a day.
Figure 8:
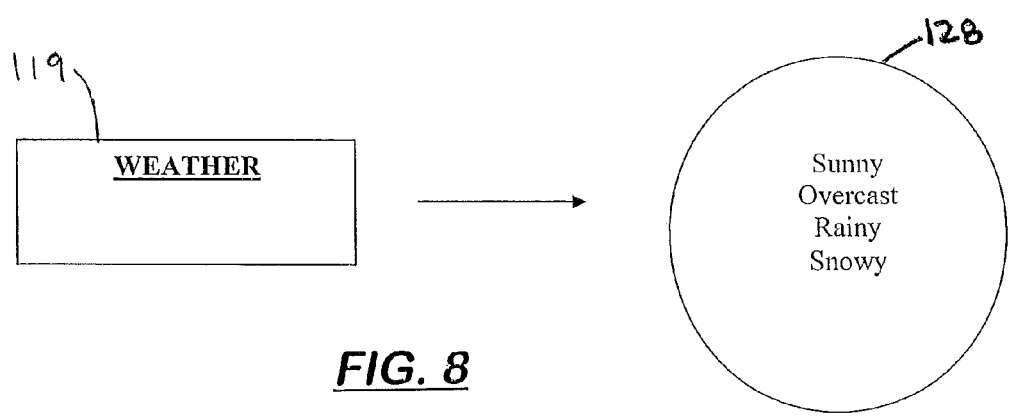
FIG. 8 is an illustration showing the Weather menu coupled to its sub-category menu containing more descriptive weather conditions such as, Sunny, Overcast, Rainy, and Snowy conditions.
Figure 9:
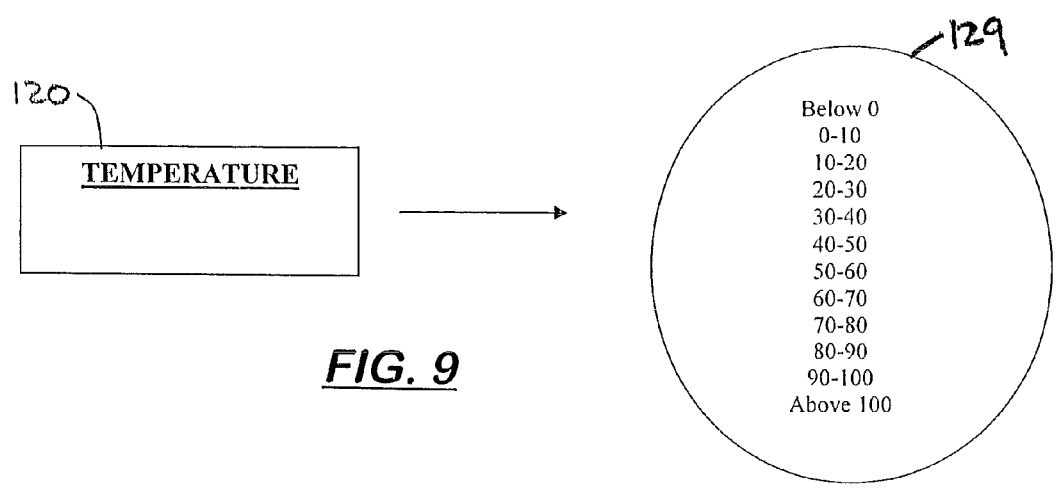
FIG. 9 is an illustration showing the Temperature menu coupled to its sub-category menu that contains various temperature ranges.

In some instances, an external condition 116-120 may be coupled to a sub-category menu 125-129, as shown in FIGS. 5-9 which break down each external condition 116-120 into more specific conditions. The audio files 62 can then be tagged to one or more of the specific conditions in the sub-category menu 125-129. As shown in FIG. 6, if the traffic external condition 116 is selected, then the sub-category menu 125 containing more specific traffic conditions, such as Light, Medium or Heavy may be displayed. If the external condition 117 is a particular day of the week, then a specific day of the week may be selected in menu 126. If a particular time of day external condition 118 is selected, then a specific hour of the day may be selected in menu 127. If weather external condition 119 is selected from menu 128, then a specific weather condition, such as Sunny, Overcast, Rainy, Snowy, may be selected. If a temperature external condition 120 is selected, then a particular temperature must be selected from its sub-category menu 129.

When the specific traffic condition is received by the electronic device, the audio files tagged to the specific traffic condition are played. The same process is used with all the other external conditions.

Using the above described system, a method for playing back audio files from a playback device, comprising the following steps:

a. Selecting an audio playback device capable of playing recorded audio sounds;

b. Selecting an external condition playback program that associates some or all of the recorded audio sounds with an external condition; and, c. Exposing the playback device to an external condition so that the audio files associated with the external condition are automatically played back.

In compliance with the statute, the invention described herein has been described in language more or less specific as to structural features. It should be understood however, that the invention is not limited to the specific features shown, since the means and construction shown is comprised only of the preferred embodiments for putting the invention into effect. The invention is therefore claimed in any of its forms or modifications within the legitimate and valid scope of the amended claims, appropriately interpreted in accordance with the doctrine of equivalents.

I claim:

1. A motor vehicle located, external condition controlled audio playback device, comprising:

a. an electronic device for playing audio files inside a motor vehicle, said electronic device configured to play individual audio files when said motor vehicle is operated;

b. means for detecting or monitoring the occurrence of at least two external conditions while said motor vehicle is operating, said two conditions being from a group of conditions that includes at least the following external conditions: the current location of the electronic device, the day of the week, the time of day, the weather condition, and the traffic condition;

c. a plurality of audio files selected by a user of said motor vehicle configured to be played by said electronic device, said audio files being associated with at least one said external condition from said group of conditions; and, d. a software program configured to monitor for said external conditions and configured to automatically play said audio files using said electronic device when said external conditions associated with said audio files occur or are detected while said motor vehicle is operated, and when different said external conditions occur or are detected, said software program automatically changes and plays said audio files associated with different said external conditions.

2. The playback device, as recited in claim 1, wherein said audio files are placed in one or more playlist and selectively tagged to one said external condition from said group of conditions so that when said external condition occurs or is detected, said audio files in said playlist associated with said external condition are automatically played.

3. The playback device, as recited in claim 1, wherein said software program is loaded into the memory of said playback device.

4. The playback device, as recited in claim 1, wherein said software program includes a first menu page that presents a plurality of said audio files that can be played by said electronic device and enables individual audio files to be selectively and individually tagged to a specific external condition.

5. The playback device, as recited in claim 1, wherein said software program includes an External Condition menu page that enables a user to list different external conditions capable of being tagged to said audio files.

6. A user input external condition controlled audio file play system, comprising:

a. an audio electronic device configured to automatically play audio files associated with at least two external conditions when said external conditions are detected or occur, said external conditions are from a group of external conditions containing at least the following external conditions: the location of the electronic device, the time of day, the weather condition, and the traffic condition;

b. means for detecting or monitoring the occurrence of at least two external conditions from said group of external conditions coupled to said electronic device; and, c. a software program configured to allow a user to manually associate at least some of said audio files to be played when two said external conditions occur or detected, said software program also configured to automatically change said audio files when different external conditions occur or detected.

7. A method of automatically playing different audio files through an electronic device in a motor vehicle based on different external conditions that may be detected or occur while operating the motor vehicle, said method comprises the following steps:

a. selecting an audio electronic device configured to play audio files stored thereon or on internal or external storage device, said audio files being associated with one of the following external conditions from the following group of external conditions: the current location of said motor vehicle, the day of the week, the time of day, the weather condition, and the traffic condition;

b. operating said motor vehicle;

c. monitoring for the occurrence or the detection of at least one of said external condition from the group of external conditions;

d. automatically playing with said electronic device said audio files associated with said external condition when said external condition occur or detected while operating said motor vehicle; and, e. automatically changing and playing said audio files with said electronic device when external condition associated with said audio files occurs or is detected.

8. The method as recited in claim 7, wherein step a further includes the sub-step of first arranging said audio files in a playlist and then tagging said playlist to one of said external conditions from said group of external conditions, so that when said external condition occurs or is detected, said audio files in said playlist tagged to said external condition are played by said electronic device.

* * * * *